United States Patent
Lam et al.

(10) Patent No.: US 8,590,143 B2
(45) Date of Patent: Nov. 26, 2013

(54) APPARATUS FOR DELIVERING SEMICONDUCTOR COMPONENTS TO A SUBSTRATE

(75) Inventors: Kui Kam Lam, Kwai Chung (CN); Yen Hsi Tang, Kwai Chung (CN); Wai Yuen Cheung, Kwai Chung (CN); Wing Kin Lam, Kwai Chung (CN)

(73) Assignee: ASM Technology Singapore Pte. Ltd., Singapore (SG)

( * ) Notice: Subject to any disclaimer, the term of this patent is extended or adjusted under 35 U.S.C. 154(b) by 72 days.

(21) Appl. No.: 13/115,261

(22) Filed: May 25, 2011

(65) Prior Publication Data

US 2012/0301251 A1    Nov. 29, 2012

(51) Int. Cl.
*B23P 19/00*    (2006.01)

(52) U.S. Cl.
USPC ............. 29/739; 29/740; 29/741; 29/566.3; 414/751.1; 414/798.3

(58) Field of Classification Search
USPC .......... 29/729, 739–742, 832–834; 228/4.5, 228/103, 180.5, 49.1; 414/752.1–752.7; 438/107–108; 156/510–518, 538–539, 156/449, 556
See application file for complete search history.

(56) References Cited

U.S. PATENT DOCUMENTS

| | | | | |
|---|---|---|---|---|
| 3,840,978 A * | 10/1974 | Lynch et al. | ................ | 228/110.1 |
| 5,186,719 A * | 2/1993 | Egashira et al. | ............. | 29/25.01 |
| 5,979,739 A * | 11/1999 | Jin et al. | .......................... | 228/6.2 |
| 6,086,641 A * | 7/2000 | Shironouchi | ................ | 29/25.01 |
| 7,179,346 B2 * | 2/2007 | Lam et al. | ...................... | 156/299 |
| 7,185,422 B2 * | 3/2007 | Sakai et al. | ...................... | 29/832 |
| 7,547,575 B2 * | 6/2009 | Tong et al. | .................... | 438/107 |
| 7,896,051 B2 * | 3/2011 | Kang et al. | ..................... | 156/539 |
| 2004/0244915 A1 * | 12/2004 | Lam et al. | ..................... | 156/510 |

* cited by examiner

*Primary Examiner* — Minh Trinh
(74) *Attorney, Agent, or Firm* — Sughrue Mion, PLLC

(57) ABSTRACT

An apparatus 200 for delivering semiconductor components 212 to a substrate 206a; 206b; 500a; 500b; 500c during semiconductor package manufacturing. The apparatus 200 comprises a platform 216 and a plurality of delivery modules 202a, 202b affixed to the platform 216. Each of the plurality of delivery modules 202a, 202b has a support device 204a; 204b for supporting the substrate 206a; 206b; 500a; 500b; 500c, as well as a delivery device 208a; 208b for delivering the semiconductor components 212 to the substrate 206a; 206b; 500a; 500b; 500c. In particular, heights of the support devices 204a, 204 are mutually leveled for conveying the substrate 206a; 206b; 500a; 500b; 500c between the plurality of delivery modules 202a, 202b.

8 Claims, 7 Drawing Sheets

US 8,590,143 B2

APPARATUS FOR DELIVERING SEMICONDUCTOR COMPONENTS TO A SUBSTRATE

FIELD OF THIS INVENTION

This invention relates to an apparatus for delivering semiconductor components to a substrate during semiconductor package manufacturing. The apparatus is particularly, but not exclusively, suitable for delivering semiconductor dice from wafer tables to leadframes during die-bonding.

BACKGROUND OF THE INVENTION

Die-attach machines are commonly used in semiconductor package manufacturing to accurately transfer semiconductor components to semiconductor substrates. For instance, a die bonder has a die-delivery head for transferring semiconductor dice from a wafer table to a leadframe in a pick-and-place operation. However, there is a limitation in the throughput of die-bonding processes—normally quantified in terms of 'Units per Hour' (UPH)—attainable by die bonders with a single bond head.

One way of increasing the UPH of such die bonders is by constructing a system of cascading die bonders. FIG. 1 shows a system 100 constructed by connecting two die bonders 102, 104 together. The system 100 comprises wafer tables 106, 108 for placing a wafer containing singulated semiconductor dice 107, support devices 110, 112 for conveying leadframes 109, 111 along an X-direction, and die-delivery devices 114, 116 having respective die-delivery heads 118, 120 for transferring the semiconductor dice 107 from the wafer tables 106, 108 to bonding locations of the leadframes 109, 111 along a Y-direction orthogonal to the X-direction. A conveying device 122 is further arranged between the two die bonders 102, 104 for transferring the leadframes 109, 111 from an offload section of the leftmost die bonder 102 to an onload section of the rightmost die bonder 104.

If other support devices 110, 112 having larger widths are used to support leadframes with corresponding larger leadframe widths, the distance travelled by the die-delivery heads 118, 120 from the wafer tables 106, 108 to the outermost edges of the leadframes along the Y-direction would be increased. This accordingly reduces the UPH of the system 100.

In addition, a large footprint is typically required to construct the system 100 which comprises two separate die bonders 102, 104 connected via the intervening conveying device 122. Thus, construction of the system 100 takes up valuable space in a factory.

Furthermore, the system 100 of cascading die bonders 102, 104 means that it has twice as many devices as that of a single die bonder. Accordingly, the probability of any one of the devices malfunctioning in the system 100 will be higher than that of a single die bonder. As the die bonders 102, 104 perform die-bonding in a sequential manner within the system 100, a malfunction of any one of the die bonders 102, 104 invariably causes an operational halt of the entire system 100, thereby affecting its UPH.

It is therefore an object of this invention to ameliorate any one of the above limitations of such systems 100 comprising cascading die bonders 102, 104.

SUMMARY OF THE INVENTION

An aspect of this invention relates to an apparatus for delivering semiconductor components to a substrate during semiconductor package manufacturing. The apparatus comprises a platform, and a plurality of delivery modules affixed to the platform. Each of the plurality of delivery modules has a support device for supporting the substrate, and a delivery device for delivering the semiconductor components to the substrate. In particular, heights of the support devices are mutually levelled for conveying the substrate between the plurality of delivery modules.

The term 'affixed' in the context of the description herein means that the plurality of delivery modules are fastened to the platform, wherein some or all of the plurality of delivery modules may be movably fastened to the platform.

Since the heights of the support devices of the apparatus are mutually levelled, the step of ensuring that the support devices are arranged at a same height may not be necessary when operating embodiments of the claimed apparatus. This advantageously saves valuable time. By contrast, such a step must be taken in the system 100 comprising cascading die bonders 102, 104 to ensure that the substrate will be properly conveyed between adjacent die bonders 102, 104. Thus, various steps involving precise measurements of the die bonders 102, 104 are required to ensure that the heights of their respective support devices 110, 112 are mutually levelled for conveying the leadframes 109, 111. This invariably consumes time and complicates the die-bonding process.

Some optional features of the apparatus are defined in the dependent claims.

For example, the plurality of delivery modules may be arranged at opposite sides of the respective support devices along the direction in which the substrate is to be conveyed. In this way, the delivery devices may be configured to deliver the semiconductor components to bonding locations at respective nearer halves of the substrate relative to the delivery devices. These respective nearer halves of the substrate are along the direction in which the substrate is to be conveyed. Since the distance travelled by the delivery devices is shortened, the UPH capacity among embodiments of the claimed apparatus can be advantageously improved. In addition, at least one of the plurality of the delivery modules may be movable in relation to the platform to arrange the respective support devices at a mutual offset along a direction transverse to the direction in which the substrate is to be conveyed. Advantageously, the UPH capacity among embodiments of the claimed apparatus may also be improved when the leadframes having narrower leadframe widths are used.

BRIEF DESCRIPTION OF THE DRAWINGS

Embodiments of the invention will now be described, by way of example only, with reference to the drawings of which.

DETAILED DESCRIPTION OF THE PREFERRED EMBODIMENT

Figure 1:
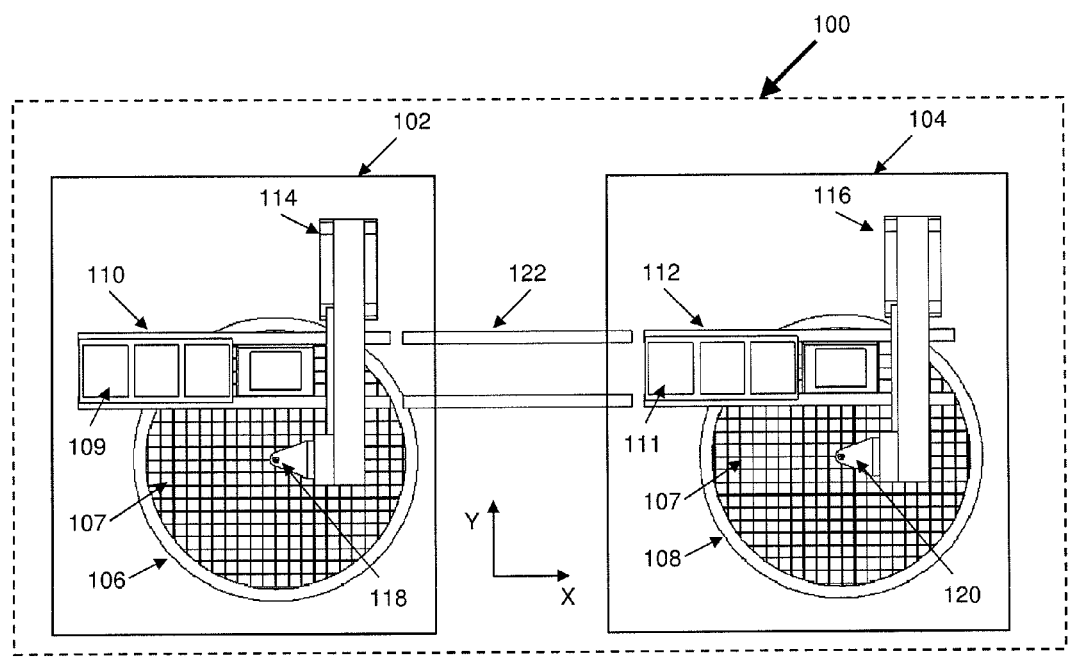
FIG. 1 shows a conventional system of cascading die bonders.
Figure 2:
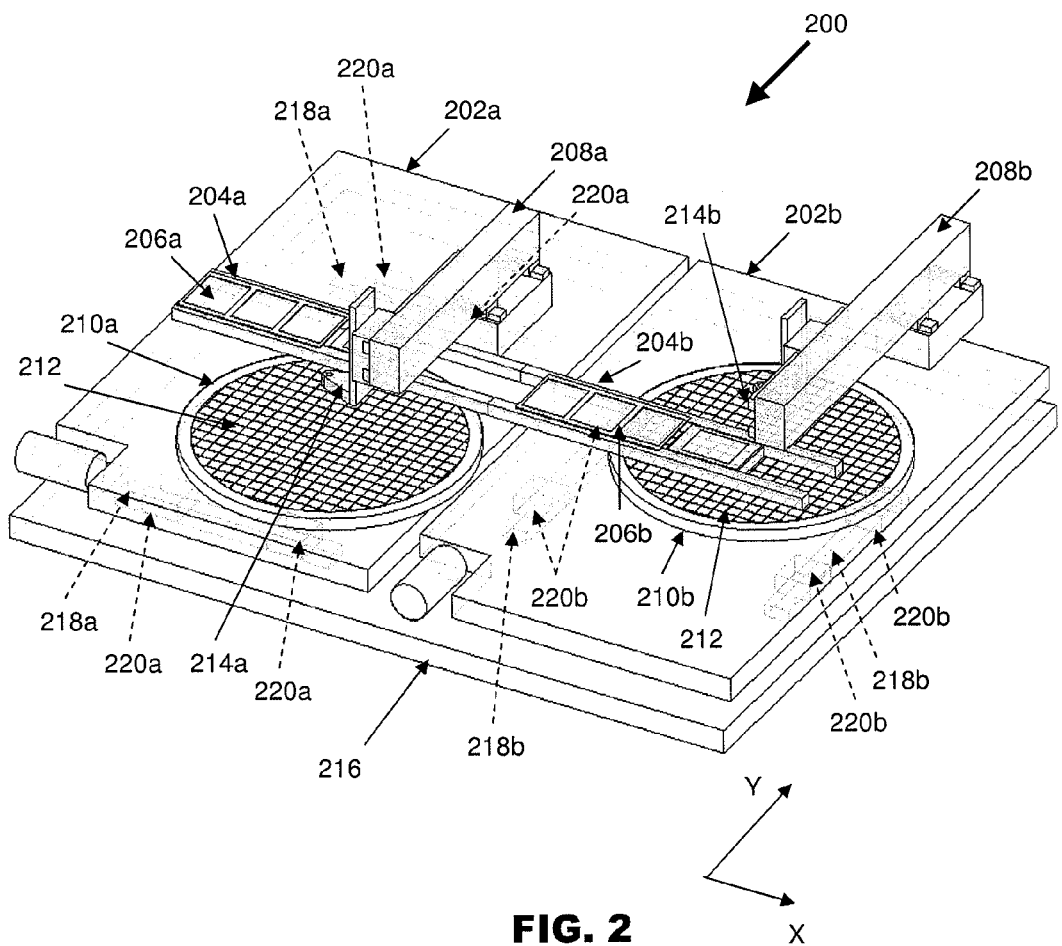
FIG. 2 is an isometric view of a preferred embodiment of the invention having two delivery modules.

FIG. 2 is an isometric view of a die bonder 200, which comprises two die-delivery modules 202a, 202b having: i) support devices 204a, 204b for conveying substrates such as leadframes 206a, 206b in an X-direction; ii) die-delivery devices 208a, 208b arranged in relation to the respective support devices 204a, 204b; iii) wafer tables 210a, 210b for placing semiconductor dice 212; and iv) pick-and-bond optical systems (not shown) to ensure accuracy of the pick-and-place operations.

Specifically, the die-delivery devices 208a, 208b includes die-delivery heads 214a, 214b configured to pick up the semiconductor dice 212 from the respective wafer tables 210a, 210b and transfer them—in a Y-direction orthogonal to the X-direction—to bonding locations of the respective leadframes 206a, 206b. The die-delivery heads 214a, 214b are arranged at opposite sides of the support devices 204a, 204b along the X-direction to improve the UPH of the die bonder 200 (more details are set out below).

In addition, the die bonder 200 includes a platform 216 to which the die-delivery devices 202a, 202b are affixed. In particular, the heights of the support devices 204a, 204b are mutually levelled when the die-delivery modules 202a, 202b are affixed to the platform 216 to ensure that the leadframes 206a, 206b are conveyed between the die-delivery modules 202a, 202b during die-bonding. FIG. 2 shows the platform 216 being an integral one-piece level platform with various tracks 218a, 218b along which the die-delivery devices 208a, 208b are adjustably movable. The arrangement of the tracks 218a, 218b as shown in FIG. 2 is solely for the sake of explanation. It should be appreciated that these tracks 218a, 218b are arranged at the undersides of the die-delivery modules 202a, 202b and would thus be hidden from view.

The die bonder 200 further includes a motion device for adjusting the relative arrangement of the delivery modules 202a, 202b. One example of the motion device is shown in FIG. 2 which—again solely for the sake of explanation—comprises rollers 220a, 220b attached to the die-delivery modules 202a, 202b and tracks 218a, 218b arranged on the platform 216. Specifically, the rollers 220a, 220b are mounted on the respective tracks 218a, 218b of the platform 216 to adjust the relative arrangement of the delivery modules 202a, 202b. It should be appreciated that the rollers 220a, 220b are arranged at the undersides of the die-delivery modules 202a, 202b, and would thus be hidden from view. As the tracks 218a, 218b are arranged along the X and Y directions respectively, the die-delivery modules 202a, 202b can accordingly be configured to move in the corresponding X and Y directions.

Adjustment in the X direction may be necessary for long leadframes that are in reel form which traverse from one die-delivery device 208a to the other die-delivery device 208b. Such adjustment ensures that the distance between bonding positions in the respective die-delivery devices 208a, 208b is equal to a multiple of a column pitch between adjacent bonding pads on the leadframe.

The die-delivery module 202a is adjustably movable along the X-direction within along a wide range of distances, whereas the die-delivery module 202b is adjustably movable along the Y-direction also within a wide range of distances, in order to add greater versatility in adapting the apparatus to different machine designs.

Figure 3:
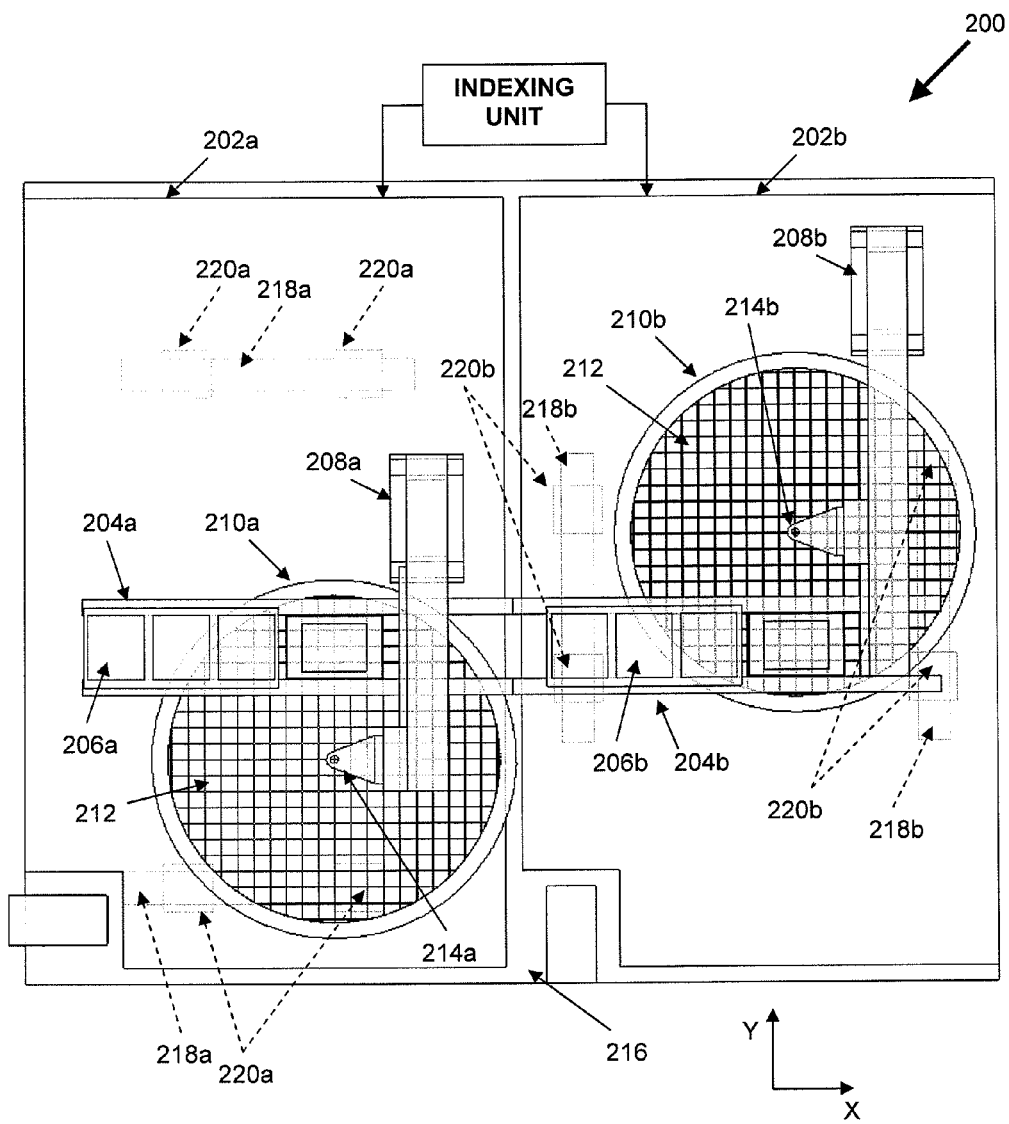
FIG. 3 is a plan view of the preferred embodiment of FIG. 2.

FIG. 3 is a plan view of the die bonder 200. Preferably, the die bonder 200 houses two delivery modules 202a, 202b within an integral chassis. In contrast with the conventional system 101 which requires two separate die bonders 102, 104 and the intervening conveying device 122, the die bonder 200 thus requires a smaller footprint.

Furthermore, each of the die bonders 102, 104 of the conventional system 101 includes a separate indexing unit for conveying the respective support devices 110, 112 by a column pitch of the leadframes 109, 111 whenever corresponding columns of bonding locations of the leadframes 109, 111 have been occupied by the semiconductor dice 107. By contrast, both the die-delivery modules 202a, 202b of the die bonder 200 may use a single indexing unit for conveying both the support devices 204a, 204b by a column pitch of the leadframes 206a, 206b during bonding of respective columns of bonding locations. Since the die bonder 200 requires fewer devices than the conventional system 100, the likelihood of any one device of the die bonder 200 malfunctioning is thus lower compared with the conventional system 100. This advantageously translates to a higher UPH capacity of the die bonder 200 throughout its useful life than the conventional system 100.

Figure 4:
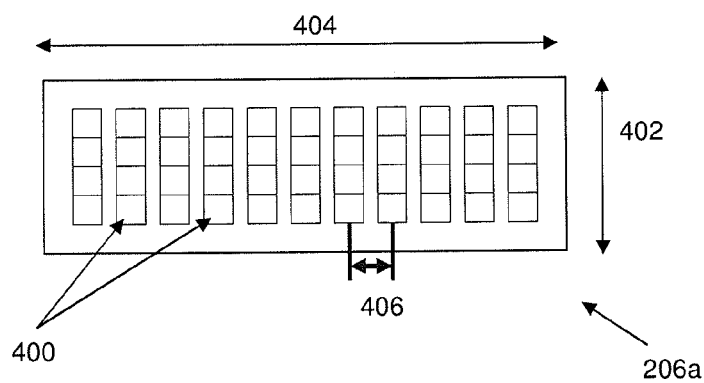
FIG. 4 is a plan view of a typical leadframe.

FIG. 4 is a plan view of the leadframe 206a having various bonding locations 400 to form a column of bonding locations 400 along the leadframe width 402. Various columns of bonding locations 400 are arranged along the leadframe length 404, and the distance between adjacent columns is defined as the 'column pitch' 406 of the leadframe.

Figure 5:
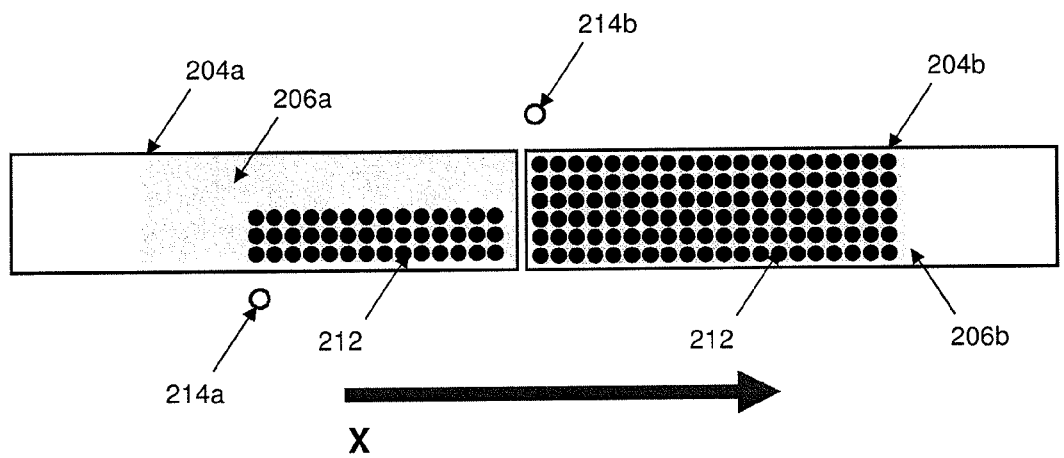
FIG. 5 illustrates a die-bonding operation undertaken by the preferred embodiment as shown in FIG. 2 and FIG. 3.

An operation of the die bonder 200 of FIG. 2 and FIG. 3 will now be explained with reference to FIG. 5. Each of the die-delivery heads 214a, 214b is responsible for transferring the semiconductor dice 212 from the respective wafer tables 210a, 210b to bonding locations of the leadframes 206a, 206b at the respective lower halves of the leadframes 206a, 206b which are nearer to the corresponding die-delivery heads 214a, 214b. With reference to FIG. 5, since the die-delivery head 214a is located next to a lower portion of the support device 204a, it is thus configured to transfer the semiconductor dice 212 from the wafer table 210a to the bonding locations at the lower half portion of the leadframe 206a. As the die-delivery head 214b is located next to an upper portion of the support device 204b, it is thus configured to transfer the semiconductor dice 212 from the wafer table 210b to the bonding locations at the upper half portion of the leadframe 206b.

By configuring the die-delivery heads 214a, 214b to transfer the semiconductor dice to the bonding locations at the respective nearer halves of the leadframes 206a, 206b relative to the corresponding die-delivery heads 214a, 214b, each die-delivery head 214a, 215b can avoid travelling the distance from the wafer tables 210a, 210b to the bonding locations at the furthermost portions of the respective leadframes 206a, 206b. Thus, the distance travelled by the die-delivery heads 214a, 214b can be shortened. This advantageously improves the UPH of the die bonder 200.

Figure 6:
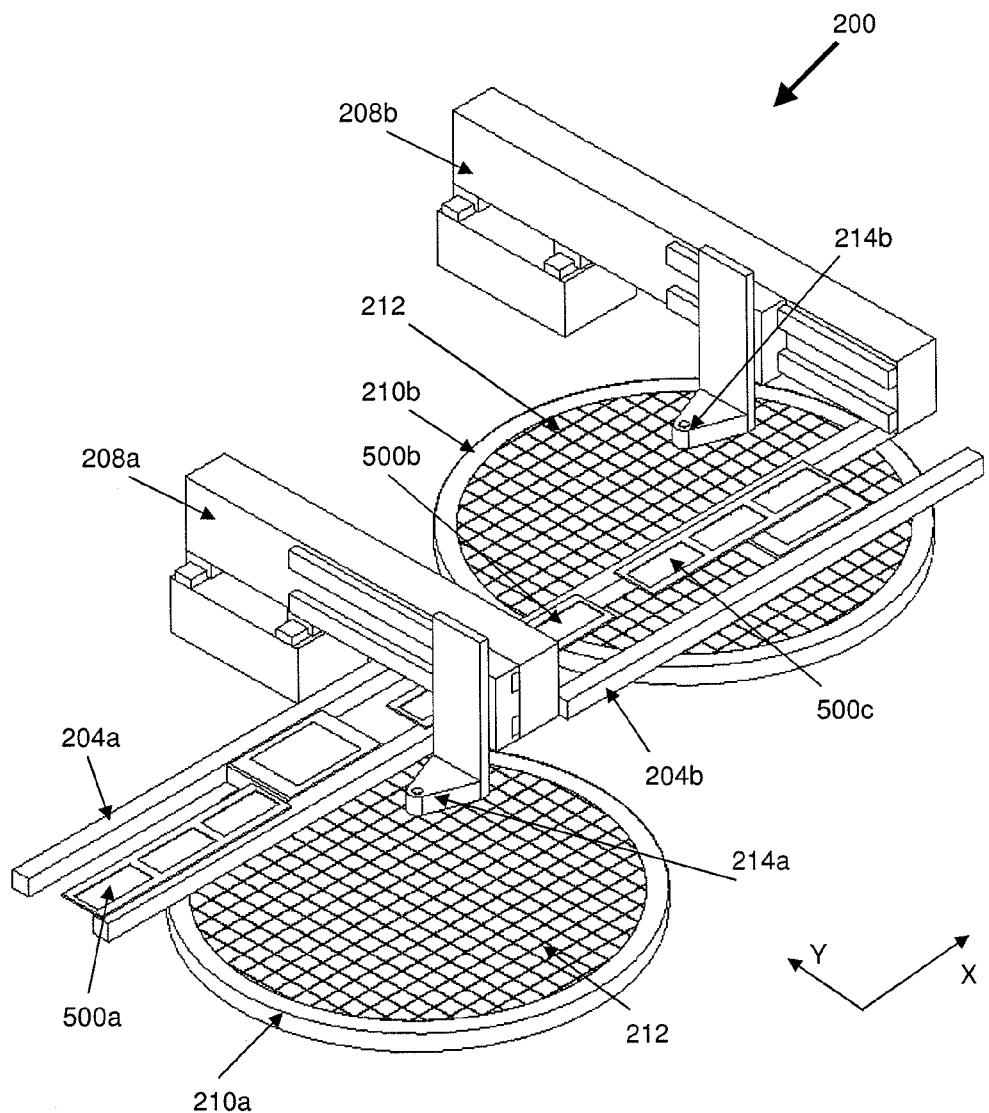
FIG. 6 is an isometric view of a different configuration of the preferred embodiment as shown in FIG. 2 and FIG. 3, in which the delivery modules are arranged at a mutual offset.

FIG. 6 is an isometric view of a different configuration of the die bonder 200. In this configuration, the die-delivery module 202b has been shifted relative to the other die-delivery module 202a in the Y-direction—which is orthogonal to the leadframe-conveying X-direction—such that the respective support devices 204a, 204b are arranged at a mutual offset in the Y-direction. Specifically, the die-delivery module 202b is shifted along with the track 218b in the Y-direction until the support devices 204a, 204b define an overlapping path in the X-direction with a path width corresponding to the width of the narrower leadframes 500a, 500b, 500c being processed.

Figure 7:
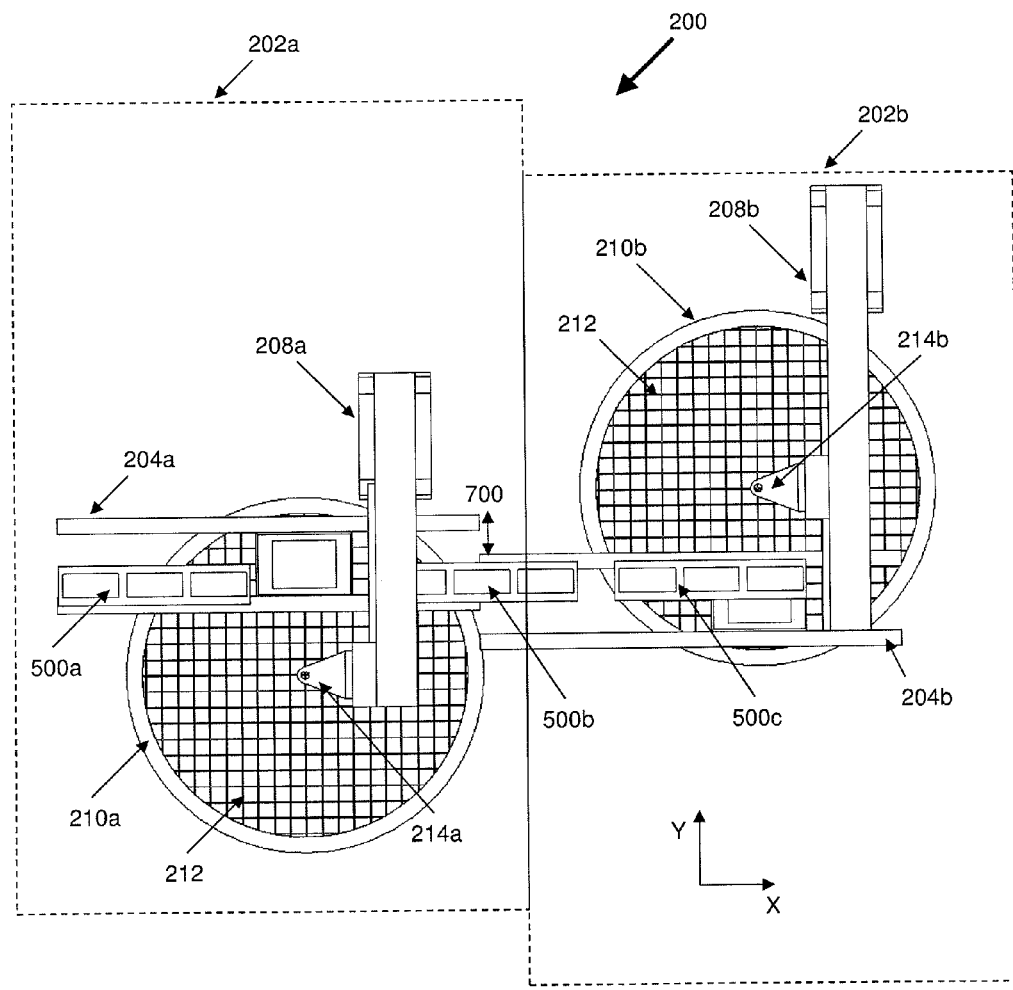
FIG. 7 is a plan view of the preferred embodiment of FIG. 6.

FIG. 7 is a plan view of the configuration of the die bonder 200 shown in FIG. 6, showing the mutual offset 700 between the support devices 204a, 204b along the Y-direction.

Figure 8:
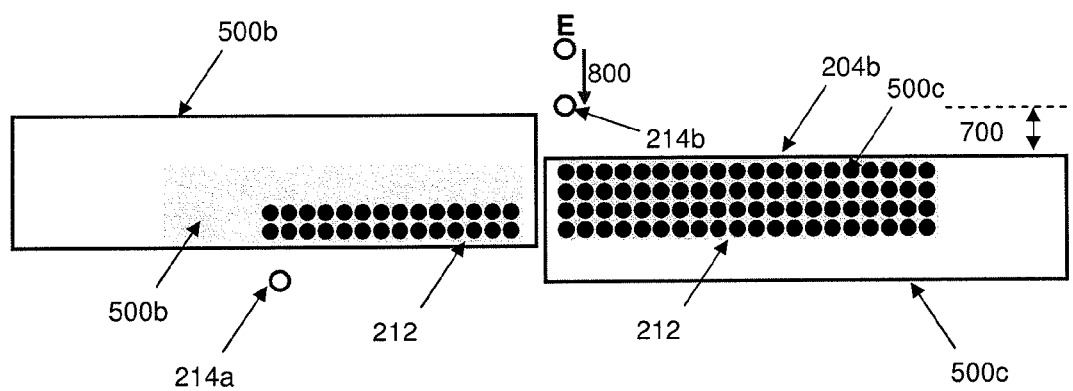
FIG. 8 illustrates a die-bonding operation undertaken by the preferred embodiment as shown in FIG. 6 and FIG. 7.

An operation of the configuration of the die bonder 200 shown in FIG. 6 and FIG. 7 will now be explained with reference to FIG. 8.

Like the die bonder operation as explained with reference to FIG. 5, each of the die-delivery heads 214a, 214b is responsible for transferring the semiconductor dice 212 from the respective wafer tables 210a, 210b to bonding locations at the respective nearer halves of the leadframes 500b, 500c relative to the die-delivery heads 214a, 214b, as the support devices 204a, 205b move in the X-direction during die-bonding. As the die-delivery head 214a is located next to the lower portion of the support device 204a, it is thus configured to transfer the semiconductor dice 212 from the wafer table 210a to the bonding locations at the lower half portion of the leadframe 500b. As for the die-delivery head 214b, since it is located next to the upper portion of the support device 204b, it is thus configured to transfer the semiconductor dice 212 from the wafer table 210b to the bonding locations at the upper half portion of the leadframe 500b.

By configuring the die-delivery heads 214a, 214b to transfer the semiconductor dice to the bonding locations at the nearer halves of the leadframes 500b, 500c relative to the die-delivery heads 214a, 214b, the die-delivery heads 214a, 214b avoid travelling a longer distance from the wafer tables 210a, 210b to the bonding locations at the respective furthermost portions of the leadframes 500a, 500b.

Without the ability to adjustably move the die-delivery module 202b such that the support devices 204a, 204b define an overlapping path with a path width corresponding to the width of the narrower leadframes 500a, 500b, 500c to be processed, the die-delivery head 214b will be located at position E as shown in FIG. 7. Consequently, the die-delivery head 214b has to move by an additional distance 800—corresponding to the mutual offset 700 between the support devices 204a, 204b in the Y-direction—for every pick-and-place operation of the die-bonder 202.

By adjusting the relative arrangement of the respective support devices 204a, 204b, the distance travelled by the die-delivery heads 214a, 214b can be shortened by the offset distance 700 for every pick-and-place step performed by the die bonder 200. Thus, it can be seen that the ability to adjust the relative arrangement of the die-delivery modules 202a, 202b to define the offset 700 between their support devices 204a, 205b means that the die-bonder 200 may be adapted for use with leadframes with narrower leadframe widths to improve the UPH capacity of the die bonder 200.

Of course, it should be appreciated that the overlapping path as defined by the support devices 204a, 204b may also have a width larger than that of the narrower leadframes 500a, 500b, 500c.

It should further be appreciated that other variations of the preferred embodiment may be possible without departing from the scope and spirit of the invention. For instance, instead of the die-delivery module 202a being movably adjustable along the X-direction, tracks extending in the orthogonal Y-direction may instead be provided on the platform 216 so that the die-delivery module 202a may also be adjustably movable along the Y-direction to arrange the respective support devices 204a, 204b at a mutual offset in the Y-direction. Also, while the preferred embodiment of this invention relates to a die bonder for transferring semiconductor dice to a leadframe, embodiments of the invention may also be used to mount electronic components to a printed circuit board (PCB) in surface mount technology applications.

The invention claimed is:

1. An apparatus for delivering semiconductor components to a substrate during semiconductor package manufacturing, the apparatus comprising:
   a platform; and
   a plurality of delivery modules affixed to the platform, each of the plurality of delivery modules having:
      a support device for supporting the substrate; and
      a delivery device for delivering the semiconductor components to the substrate,
   wherein heights of each respective support device of the plurality of delivery modules are mutually leveled for conveying the substrate between the plurality of delivery modules,
   wherein the delivery devices are arranged at opposite sides of the respective support devices along a direction in which the substrate is to be conveyed, and
   wherein the delivery devices are operative to deliver the semiconductor components to bonding locations at respective halves of the substrate that are nearer to the delivery devices, the respective halves of the substrate being divided along a line parallel to the direction in which the substrate is to be conveyed.

2. The apparatus of claim 1, comprising a single indexing unit for controllably conveying the substrate on the support devices.

3. An apparatus for delivering semiconductor components to a substrate during semiconductor package manufacturing, the apparatus comprising:
   a platform; and
   a plurality of delivery modules affixed to the platform, each of the plurality of delivery modules having:
      a support device for supporting the substrate; and
      a delivery device for delivering the semiconductor components to the substrate,
   wherein heights of each respective support device of the plurality of delivery modules are mutually leveled for conveying the substrate between the plurality of delivery modules, and
   wherein at least one of the plurality of delivery modules is affixed to the platform such that it is movable relative to the platform to arrange the support devices at a mutual offset in a direction transverse to a direction in which the substrate is to be conveyed.

4. The apparatus of claim 3, wherein the at least one of the plurality of delivery modules is movable along the direction transverse to the direction in which the substrate is to be conveyed.

5. The apparatus of claim 3, wherein at least one of the plurality of delivery modules is further movable in the direction in which the substrate is to be conveyed.

6. The apparatus of claim 3, further comprising a motion device for adjusting the mutual offset of the plurality of delivery modules.

7. The apparatus of claim 6, wherein the motion device comprises:
   a track arranged on the platform; and
   a plurality of wheels attached to at least one of the delivery modules to move the delivery module along the track.

8. The apparatus of claim 3, comprising a single indexing unit for controllably conveying the substrate on the support devices.

\* \* \* \* \*